United States Patent
Sangu et al.

(10) Patent No.: US 12,474,555 B2
(45) Date of Patent: Nov. 18, 2025

(54) LASER CRYSTALLIZATION APPARATUS

(71) Applicant: Samsung Display Co., LTD., Yongin-si (KR)

(72) Inventors: Akifumi Sangu, Hwaseong-si (KR); Je Kil Ryu, Suwon-si (KR); Cheol Ho Park, Suwon-si (KR); Hae Sook Lee, Hwaseong-si (KR); Jin Hong Jeun, Hwaseong-si (KR); Young Su Chae, Anyang-si (KR); Gyoo Wan Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 678 days.

(21) Appl. No.: 17/509,300

(22) Filed: Oct. 25, 2021

(65) Prior Publication Data

US 2022/0214531 A1 Jul. 7, 2022

(30) Foreign Application Priority Data

Jan. 5, 2021 (KR) .................. 10-2021-0000898

(51) Int. Cl.
*G02B 17/00* (2006.01)
*B23K 26/50* (2014.01)
(Continued)

(52) U.S. Cl.
CPC ............ *G02B 17/004* (2013.01); *B23K 26/50* (2015.10); *H01L 21/67115* (2013.01); *H01L 21/02678* (2013.01)

(58) Field of Classification Search
CPC ............ G02B 17/004; H01L 21/67115; H01L 21/02678
(Continued)

(56) References Cited

U.S. PATENT DOCUMENTS

| 582,551 | A | 5/1897 | Sewison |
| 6,765,725 | B1 | 7/2004 | Fermann et al. |

(Continued)

FOREIGN PATENT DOCUMENTS

| CN | 1473279 A | * | 2/2004 | ............ G03B 21/00 |
| JP | 2009182051 A | * | 8/2009 | |

(Continued)

OTHER PUBLICATIONS

Translation of 2000305176 (Year: 2024).*
(Continued)

*Primary Examiner* — Jerry L Brooks
(74) *Attorney, Agent, or Firm* — CANTOR COLBURN LLP

(57) ABSTRACT

A laser crystallization apparatus according to an embodiment includes: a light source unit which irradiates a laser beam; and a path conversion unit which converts the laser beam incident from the light source unit into a linear beam having a long axis parallel to a first direction and a short axis parallel to a second direction. The linear beam propagates in a third direction perpendicular to the first direction and the second direction, the path conversion unit includes an incident window extending parallel to a first length direction, an emission window extending parallel to a second direction, a first reflection unit disposed at the same side with the incident window, and a second reflection unit disposed at the same side with the emission window, and the second length direction extends parallel to the first direction in a view of the third direction.

13 Claims, 17 Drawing Sheets

(51) Int. Cl.
*H01L 21/02* (2006.01)
*H01L 21/67* (2006.01)

(58) Field of Classification Search
USPC .......................................... 359/861
See application file for complete search history.

(56) References Cited

U.S. PATENT DOCUMENTS

| | | |
|---|---|---|
| 9,742,155 B2 | 8/2017 | Dubost et al. |
| 2013/0329397 A1* | 12/2013 | Shimizu ................ F21V 7/26 362/84 |
| 2019/0151987 A1 | 5/2019 | Huonker et al. |
| 2021/0405517 A1* | 12/2021 | Tanaka ............... G03B 21/2013 |
| 2022/0297232 A1* | 9/2022 | Huonker ............. B23K 26/352 |

FOREIGN PATENT DOCUMENTS

| | | |
|---|---|---|
| KR | 100864017 B1 | 10/2008 |
| KR | 1020160145910 A | 12/2016 |
| KR | 101738155 B1 | 5/2017 |
| KR | 1020190034589 A | 4/2019 |
| KR | 1020210141799 | 11/2021 |
| KR | 1020220030441 | 3/2022 |
| WO | 9515510 | 6/1995 |
| WO | 2018019374 | 2/2018 |

OTHER PUBLICATIONS

Translation of CN 1473279 (Year: 2025).*
Extended European Search Report—European Patent Application No. 21217520.2 dated May 11, 2022, citing references listed within.

* cited by examiner

LASER CRYSTALLIZATION APPARATUS

This application claims priority to Korean Patent Application No. 10-2021-0000898, filed on Jan. 5, 2021, and all the benefits accruing therefrom under 35 U.S.C. § 119, the content of which in its entirety is herein incorporated by reference.

BACKGROUND

1. Field

The present disclosure relates to a laser crystallization apparatus.

2. Description of the Related Art

A liquid crystal display ("LCD") and an organic light emitting diode ("OLED") display, which are types of flat panel display devices, can be fabricated to be thin and light, so they are commonly used as a display device for mobile electronic devices, and their application coverage is being extended to large-scale display devices. In particular, as a desire for a display device requiring high speed operational characteristics emerges, research for such a display device is actively ongoing.

In order to satisfy the high-speed operation characteristic, a channel part of a thin film transistor is formed using poly-silicon instead of amorphous silicon.

An annealing method using a laser is one of conventional methods for forming polycrystalline silicon.

Meanwhile, as the glass substrate for forming the display device becomes larger, it is important to irradiate a uniform laser beam over a wide area.

SUMMARY

Embodiments are to provide a laser crystallization apparatus capable of irradiating a uniform laser beam to a large-sized area.

It is apparent that the aspects of the embodiments are not limited to the above-described aspect, but may be variously extended within a range without departing from the spirit and scope of the embodiments.

A laser crystallization apparatus according to an embodiment includes: a light source unit which irradiates a laser beam; and a path conversion unit which converts the laser beam incident from the light source unit into a linear beam having a long axis parallel to a first direction and a short axis parallel to a second direction. The linear beam propagates in a third direction perpendicular to the first direction and the second direction, the path conversion unit includes an incident window extending parallel to a first length direction, an emission window extending parallel to a second length direction crossing the first length direction, a first reflection unit disposed at the same side with the incident window, and a second reflection unit disposed at the same side with the emission window, and the second length direction extends parallel to the first direction in a view of the third direction.

The first reflection unit and the second reflection unit may face each other along a direction perpendicular to the first length direction and the second length direction.

The incident window, the emission window, the first reflection unit, and the second reflection unit may be monolithic.

The laser crystallization apparatus may further include: a first heat sink disposed outside the first reflection unit; and a second heat sink disposed outside the second reflection unit.

A laser crystallization apparatus according to an embodiment includes: a plurality of light source units which irradiates a laser beam; and a first path conversion unit and a second path conversion unit which convert the laser beam incident from the light source units into a linear beam having a long axis parallel to a first direction and a short axis parallel to a second direction. The first path conversion unit may include a first incident window, a first emission window, a first reflection unit, and a second reflection unit, the second path conversion unit may include a second incident window, a second emission window, a third reflection unit, and a fourth reflection unit, the first incident window of the first path conversion unit, the first reflection unit of the first path conversion unit, the third reflection unit of the second path conversion unit, and the second incident window of the second path conversion unit may be sequentially positioned along the first direction, the first emission window of the first path conversion unit and the second reflection unit of the first path conversion unit may be sequentially positioned along the second direction, and the fourth reflection unit of the second path conversion unit and the second emission window of the second path conversion unit may be sequentially positioned along the second direction.

A laser crystallization apparatus according to an embodiment includes: a plurality of light source units which irradiates a laser beam; and a first path conversion unit and a second path conversion unit which convert the laser beam incident from the light source units into a linear beam having a long axis parallel to a first direction and a short axis parallel to a second direction. The first path conversion unit includes a first incident window, a first emission window, a first reflection unit, and a second reflection unit, the second path conversion unit includes a second incident window, a second emission window, a third reflection unit, and a fourth reflection unit, the first incident window and the second incident window extend parallel to a first length direction, and the first emission window and the second emission window extend parallel to a second length direction crossing the first length direction, the linear beam propagates in a third direction perpendicular to the first direction and the second direction, and the second length direction extends parallel to the first direction in a view of the third direction.

The first reflection unit and the second reflection unit may face each other along a direction perpendicular to the first length direction and the second length direction, and the second reflection unit and the fourth reflection unit may face each other along the direction perpendicular to the first length direction and the second length direction.

The first incident window, the first emission window, the first reflection unit, and the second reflection unit may be monolithic, and the second incident window, the second emission window, the third reflection unit, and the fourth reflection unit may be monolithic.

The first path conversion unit and the second path conversion unit may be separated from each other along the first direction.

According to the laser crystallization apparatus of the embodiments, the uniform laser beam may be irradiated to the large-sized area.

The effects of the embodiments are not limited to the above-described effect, and it is obvious that it may be variously extended in a range that does not deviate from the spirit and scope of the embodiments.

DETAILED DESCRIPTION

Figure 1:
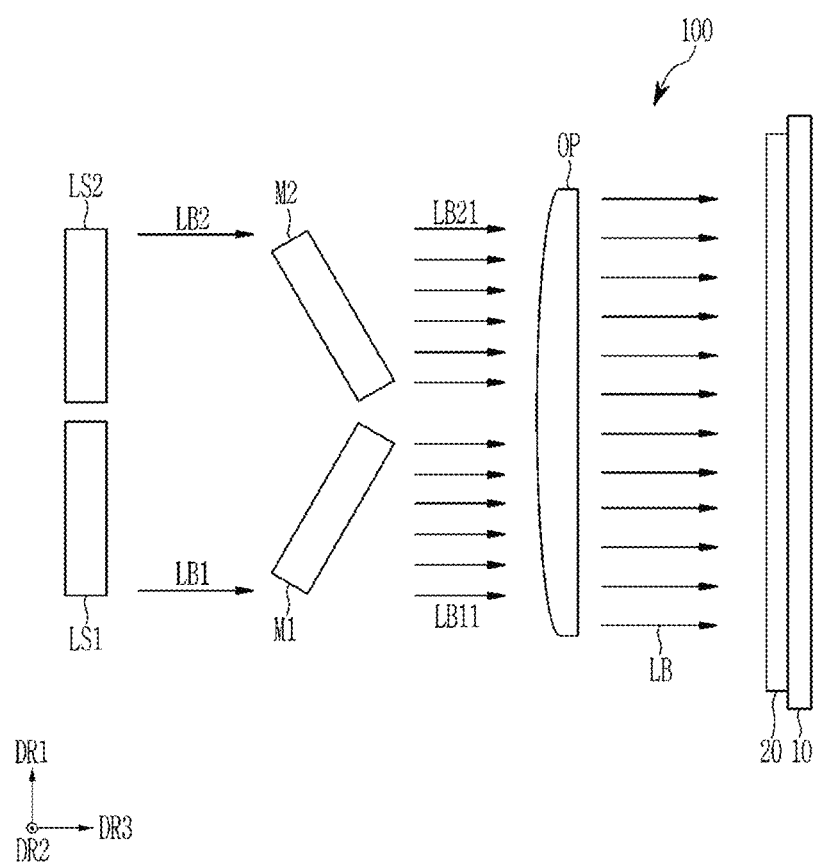
FIG. 1 is a schematic layout view showing a laser crystallization apparatus according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

In the drawings, size and thickness of each element are arbitrarily illustrated for convenience of description, and the present invention is not necessarily limited to as illustrated in the drawings. In the drawings, the thickness of layers, films, panels, regions, etc., are exaggerated for clarity. In the drawings, the thicknesses of layers and regions are exaggerated for convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise", and variations such as "comprises" or "comprising", will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Throughout the specification, the phrase "on a plane" means viewing the object portion from the top, and the phrase "on a cross-section" means viewing a cross-section of which the object portion is vertically cut from the side.

In addition, in the specification, when referring to "connected to", this does not mean only that two or more constituent elements are directly connected to each other, but the two or more constituent elements may be indirectly connected and physically connected through other constituent elements, and they may also be electrically connected or referred to by different names depending on the position or function, and may mean that they are one body.

Figure 2:
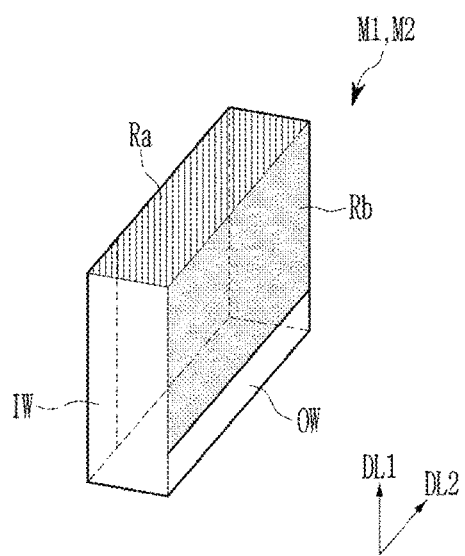
FIG. 2 is a view showing a part of a laser crystallization apparatus of FIG. 1.

Now, a laser crystallization apparatus according to an embodiment is described with reference to FIG. 1 and FIG. 2. FIG. 1 is a schematic layout view showing a laser crystallization apparatus according to an embodiment, and FIG. 2 is a view showing a part (i.e., path conversion unit) of a laser crystallization apparatus of FIG. 1.

First, referring to FIG. 1, the laser crystallization apparatus 100 according to the present embodiment includes a plurality of light source units LS1 and LS2, a plurality of path conversion units M1 and M2, and an optical unit OP.

The laser crystallization apparatus 100 supplies a laser beam LB on a substrate 10 including an amorphous silicon thin film 20.

If the laser beam LB is supplied to the amorphous silicon thin film 20, the amorphous silicon thin film 20 of the substrate 10 may be changed into polycrystalline silicon through solidification crystallization after melting.

The laser beam LB may propagate to the third direction DR3 and have a line shape extending in a direction parallel to the first direction DR1. When an intensity of the laser beam is uniform in the first direction DR1, which is the length direction of the laser beam LB, and the second direction DR2, which is the width direction of the laser beam LB, a crystallization step of being changed into polycrystalline silicon may be uniformly performed.

The laser beams LB1 and LB2 supplied in the third direction DR3 from a plurality of light source units LS1 and LS2 are diffused along the first direction DR1 through a plurality of path conversion units M1 and M2 and are supplied as the laser beam LB of the line shape through the optical unit OP.

In the illustrated embodiment, the optical unit OP is illustrated as a lens, but the invention is not limited thereto, and the optical unit OP may include at least one of optical apparatuses such as a condenser lens for a long axis, a mirror, a projection lens for a short axis, and a window.

Now, a structure of a path conversion unit of a laser crystallization apparatus according to an embodiment is described with reference to FIG. 2. FIG. 2 is a perspective view showing a part of a laser crystallization apparatus according to an embodiment.

Referring to FIG. 2, the path conversion units M1 and M2 of the laser crystallization apparatus 10 according to an embodiment have an integrated structure including an incident window IW into which the laser beam is incident, two reflection units Ra and Rb facing each other so that the incident laser beam is reflected several times through the reflection units Ra and Rb, and an emission window OW in which the reflected laser beam is emitted to the outside (i.e., to the substrate 10).

Light passes through the incident window IW and the emission window OW.

The incident window IW may have a rectangle shape elongated in a direction parallel to the first length direction DL1, and the emission window OW may have a rectangle shape elongated in a direction parallel to the second length direction DL2. The shapes of the incident window IW and the emission window OW are not limited to the rectangle shape and may be deformed to various shapes in another embodiment.

The first length direction DL1 and the second length direction DL2 may be directions perpendicular to each other.

The first length direction DL1 of the incident window IW may be a direction approximately parallel to the second direction DR2, which is the width direction of the laser beam LB of the line shape irradiated to the substrate 10, and the second length direction DL2 of the emission window OW may be a direction almost parallel to the first direction DR1, which is the length direction (i.e., longitudinal direction) of the laser beam LB of the line shape irradiated to the substrate 10. That is, when the second length direction DL2 is projected on the major surface plane of the substrate 10, the projected direction may be parallel to the first direction DR1. In other words, the emission window OW may extend in a direction parallel to the first direction DR1 when viewed in the third direction DR3 to which the laser beam LB may propagate.

Referring to FIG. 2 along with FIG. 1, the first length direction DL1 of the incident window IW may be a direction approximately parallel to the second direction DR2, which is the width direction of the laser beam LB of the line shape irradiated to the substrate 10, and the second length direction DL2 of the emission window OW may be a direction almost parallel to the first direction DR1, which is the length direction (i.e., longitudinal direction) of the laser beam LB of the line shape irradiated to the substrate 10.

The laser beam LB may have the line shape extending in the direction parallel to the first direction DR1. When the intensity of the laser beam is uniform in the first direction DR1, which is the length direction of the laser beam LB and the second direction DR2, which is the width direction of the laser beam LB, the crystallization step of being changed into the polycrystalline silicon may be uniformly performed.

Two reflection units Ra and Rb face each other along a direction parallel to a direction perpendicular to the first length direction DL1 and the second length direction DL2.

The reflection unit Ra and the incident window IW form the first surface of the path conversion units M1 and M2, and the reflection unit Rb and the emission window OW form the second surface of the path conversion units M1 and M2. The first surface and the second surface are surfaces facing each other, and the areas of the first surface and the second surface may be the same, but the areas are not limited thereto.

Two reflection units Ra and Rb facing each other include a layer that reflects light, and for example, may include a mirror.

The path conversion units M1 and M2 each have the shape in which the incident window IW and the emission window OW, and two reflection units Ra and Rb facing each other, are formed of one body (i.e., monolithic). For example, as shown in FIG. 2, the path conversion units M1 and M2 each have the hexahedron shape, and a surface including the reflection unit Ra and the incident window IW, and another surface including the reflection unit Rb and the emission window OW may face each other among six surfaces of the hexahedron. However, the present invention is not limited thereto, and the path conversion units M1 and M2 may have various other shapes in which the incident window IW and the emission window OW, and two reflection units Ra and Rb facing each other, are monolithic.

The path conversion units M1 and M2 of the laser crystallization apparatus according to an embodiment each includes two reflection units Ra and Rb facing each other while having the incident window IW and the emission window OW, respectively, so that the laser beam incident through the simple structure may be converted into the laser beam of the line shape extending in the direction parallel to the first direction DR1.

Also, the laser crystallization apparatus according to an embodiment includes a plurality of path conversion units M1 and M2, so that the uniform laser beam may be converted to be symmetric in the first direction DR1 and the second direction DR2 perpendicular to the first direction DR1, that is, the long-axis direction and the short-axis direction of the laser beam, respectively. This is described in more detail later.

Figure 3:
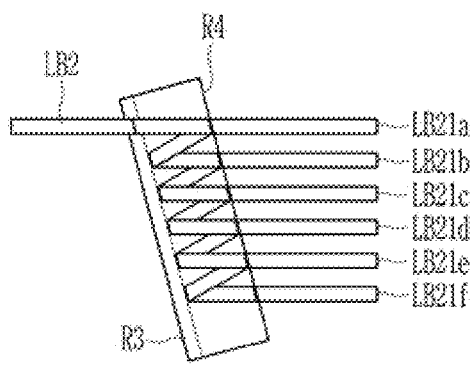
FIG. 3 is a view conceptually showing a laser beam path conversion method of a path conversion unit of a laser crystallization apparatus according to an embodiment.
Figure 3:
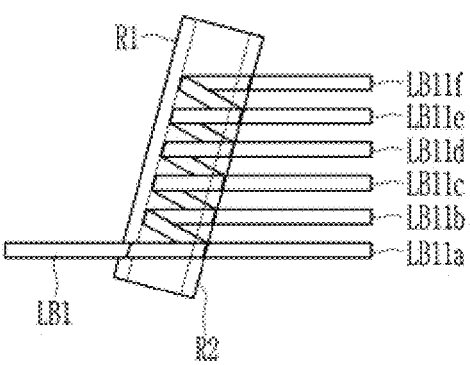
Figure 3:
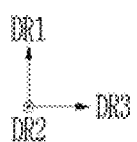

Hereinafter, the laser crystallization apparatus 100 according to an embodiment is described in more detail with reference to FIG. 3 to FIG. 5 along with FIG. 1 and FIG. 2. FIG. 3 is a view conceptually showing a laser beam path conversion method of a path conversion unit of a laser crystallization apparatus according to an embodiment, FIG. 4 is a view conceptually showing an arrangement of a path conversion unit of a laser crystallization apparatus according to an embodiment, FIG. 5 is a perspective view conceptually showing a laser beam path conversion method of a path conversion unit of a laser crystallization apparatus according to an embodiment.

Figure 4:
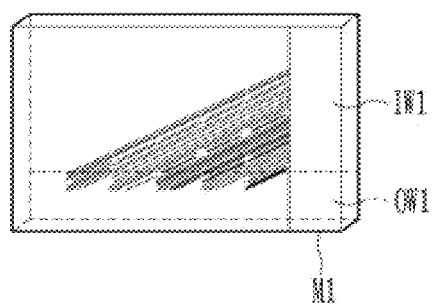
FIG. 4 is a view conceptually showing an arrangement of a path conversion unit of a laser crystallization apparatus according to an embodiment.
Figure 4:
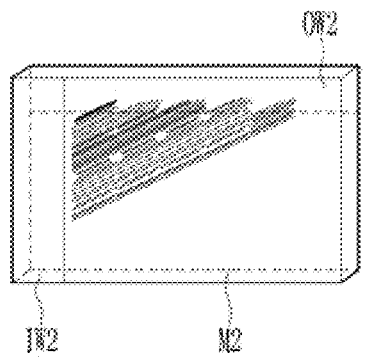
Figure 4:
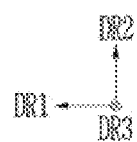
Figure 5:
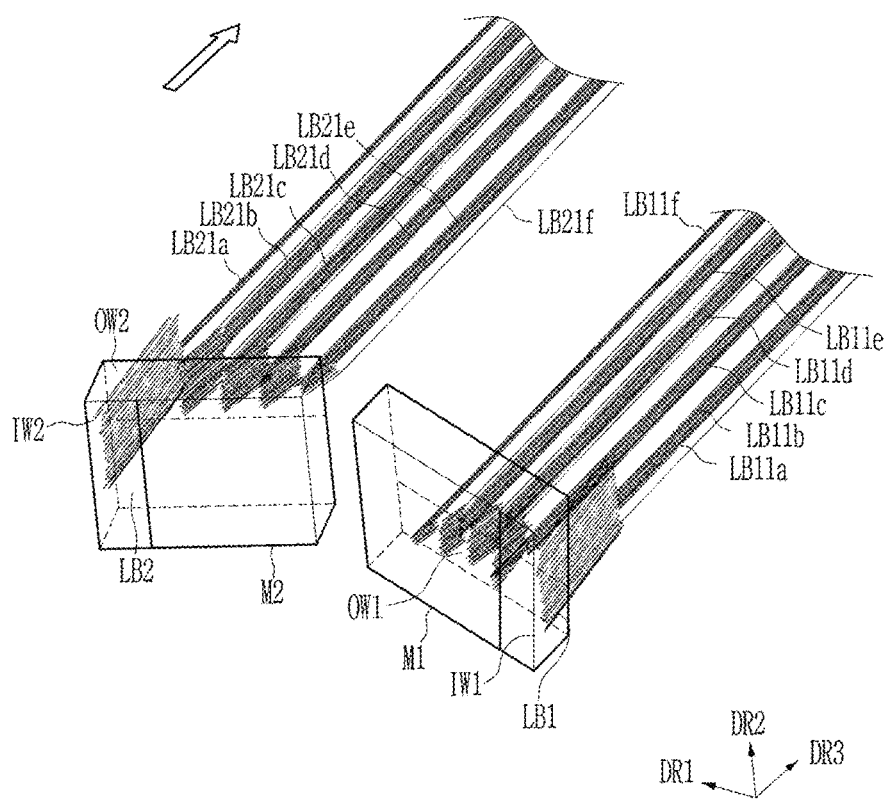
FIG. 5 is a perspective view conceptually showing a laser beam path conversion method of a path conversion unit of a laser crystallization apparatus according to an embodiment.

Referring to FIG. 3 to FIG. 5 along with FIG. 1 and FIG. 2, a plurality of path conversion units M1 and M2 of the laser crystallization apparatus 100 according to an embodiment include a first path conversion unit M1 and a second path conversion unit M2 disposed to be separated along the first direction DR1.

The first laser beam LB1 supplied from the first light source unit LS1 among a plurality of light source units LS1 and LS2 of the laser crystallization apparatus 100 is incident through the first incident window IW1 of the first path conversion unit M1 and then is repeatedly reflected by the first reflection unit R1 and the second reflection unit R2 of the first path conversion unit M1, and then is emitted through the first emission window OW1 of the first path conversion unit M1. For example, the first laser beam LB1 incident from the first light source unit LS1 to the first incident window IW1 of the first path conversion unit M1 is reflected multiple times at the surface of the first reflection unit R1 and the surface of the second reflection unit R2 and then is divided into a plurality of first emission beams LB11a, LB11b, LB11c, LB11d, LB11e, and LB11f and diffused into the first direction DR1 and is emitted to the substrate 10. A plurality of first emission beams LB11a, LB11b, LB11c, LB11d, LB11e, and LB11f may include a first beam LB11a, a second beam LB11b, a third beam LB11c, a fourth beam LB11d, a fifth beam LB11e, and a sixth beam LB11f in order away from the first incident window IW1 of the first path conversion unit M1 along the first direction DR1.

The first beam LB11a, the second beam LB11b, the third beam LB11c, the fourth beam LB11d, the fifth beam LB11e, and the sixth beam LB11f may be reflected with the number of the different reflections from the surface of the first reflection unit R1 and the surface of the second reflection unit R2. In the illustrated embodiment, it is described that a plurality of first emission beams LB11a, LB11b, LB11c, LB11d, LB11e, and LB11f include the first beam LB11a to the sixth beam LB11f, but the invention is not limited thereto, and the first emission beams LB11a, LB11b, LB11c, LB11d, LB11e, and LB11f may be a continuous beam emitted through the first emission window OW1 and may include numerous beams.

Similarly, the second laser beam LB2 supplied from the second light source unit LS2 among a plurality of light source units LS1 and LS2 of the laser crystallization apparatus 100 is incident through the second incident window IW2 of the second path conversion unit M2 and then is repeatedly reflected by the third reflection unit R3 and the fourth reflection unit R4 of the second path conversion unit M2, and then is emitted through the second emission window OW2 of the second path conversion unit M2. For example, the second laser beam LB2 incident from the second light source unit LS2 to the second incident window IW2 of the second path conversion unit M2 is reflected multiple times at the surface of the third reflection unit R3 and the surface of the fourth reflection unit R4, and then is divided into a plurality of second emission beams LB21a, LB21b, LB21c, LB21d, LB21e, and LB21f and diffused along the first direction DR1 to be emitted to the substrate 10. A plurality of second emission beams LB21a, LB21b, LB21c, LB21d, LB21e, and LB21f may include a seventh beam LB21a, an eighth beam LB21b, a ninth beam LB21c, a tenth beam LB21d, an eleventh beam LB21e, and twelfth beam LB21f in order away from the second incident window IW2 of the second path conversion unit M2 along the direction parallel to the first direction DR1.

The seventh beam LB21a, the eighth beam LB21b, the ninth beam LB21c, the tenth beam LB21d, the eleventh beam LB21e, and the twelfth beam LB21f may be reflected with the different number of the reflections from the surface of the third reflection unit R3 and the surface of the fourth reflection unit R4. In the illustrated embodiment, a plurality of second emission beams LB21a, LB21b, LB21c, LB21d, LB21e, and LB21f are shown to include the seventh beam LB21a to the twelfth beam LB21f, but the invention is not limited thereto, and the second emission beams LB21a, LB21b, LB21c, LB21d, LB21e, and LB21f may be continuous beams emitted through the second emission window OW2 and may include numerous beams.

A plurality of first emission beams LB11a, LB11b, LB11c, LB11d, LB11e, and LB11f and a plurality of second emission beams LB21a, LB21b, LB21c, LB21d, LB21e, and LB21f may be together irradiated to the substrate 10 through the optical unit OP of FIG. 1 as the laser beam LB.

Referring to FIG. 4, based on the direction parallel to the first direction DR1, the first incident window IW1 of the first path conversion unit M1 may be positioned on the first side, for example, the right direction with respect to the first reflection unit R1, and the second incident window IW2 of the second path conversion unit M2 may be positioned on the second side opposite to the first side with respect to the third reflection unit R3, for example the left direction. That is, the first incident window IW1 of the first path conversion unit M1 and the second incident window IW2 of the second path conversion unit M2 may be disposed on the edges of the first path conversion unit M1 and the second path conversion unit M2 along the first direction DR1.

In addition, based on the direction parallel to the second direction DR2, the first emission window OW1 of the first path conversion unit M1 may be positioned on the third side of the second reflection unit R2, for example, in the downward direction, and the second emission window OW2 of the second path conversion unit M2 may be positioned on the fourth side opposite to the third side with respect to the fourth reflection unit R4, for example, in the upward direction. That is, the first emission window OW1 of the first path conversion unit M1 and the second emission window OW2 of the second path conversion unit M2 may be disposed in the positions opposite to each other along the second direction DR2.

As such, by differently disposing the relative positions of the first incident window IW1 and the first emission window OW1 of the first path conversion unit M1 and the second incident window IW2 and the second emission window OW2 of the second path conversion unit M2, the first emission beams LB11a, LB11b, LB11c, LB11d, LB11e, and LB11f emitted through the first path conversion unit M1 and the second emission beams LB21a, LB21b, LB21c, LB21d, LB21e, and LB21f emitted through the second path conversion unit M2 may be symmetrical to each other along the first direction DR1 and the second direction DR2, and accordingly, the laser beam LB having a constant intensity may be emitted along the first direction DR1 and the second direction DR2.

Referring to FIG. 3, the first path conversion unit M1 and the second path conversion unit M2 may each be disposed to form a predetermined angle with respect to the first direction DR1 and another predetermined angle with respect to the third direction DR3, the predetermined angles formed between the first path conversion unit M1, and the first direction DR1 and the third direction DR3 may be the same as or different from the corresponding angles formed between the second path conversion unit M2, and the first direction DR1 and the third direction DR3.

Also, referring to FIG. 5, the first path conversion unit M1 and the second path conversion unit M2 may each be disposed to achieve a predetermined angle with respect to the second direction DR2, and the angle between the first path conversion unit M1 and the second direction DR2 may be the same as or different from the angle between the second path conversion unit M2 and the second direction DR2.

As such, the first path conversion unit M1 and the second path conversion unit M2 may each be disposed not to be parallel to the first direction DR1, the second direction DR2, and the third direction DR3, and may be disposed in a direction parallel to the first direction DR1 according to an embodiment. The arrangement of the first path conversion unit M1 and the second path conversion unit M2 may be changed depending on the positions of the incident laser beams LB1 and LB2 and the optical unit OP, and the position of the substrate 10.

Referring to FIG. 5 along with FIG. 3, along the first direction DR1, the first incident window IW1 of the first path conversion unit M1, the first reflection unit R1 of the first path conversion unit M1, the third reflection unit R3 of the second path conversion unit M2, and the second incident window IW2 of the second path conversion unit M2 may be sequentially positioned, along the second direction DR2, the first emission window OW1 of the first path conversion unit M1 and the second reflection unit R2 of the first path conversion unit M1 may be sequentially positioned, similarly, along the second direction DR2, and the fourth reflection unit R4 of the second path conversion unit M2 and the second emission window OW2 of the second path conversion unit M2 may be sequentially positioned.

According to the embodiment shown in FIG. 5, the first emission window OW1 of the first path conversion unit M1 and the second emission window OW2 of the second path conversion unit M2 are shown to be disposed side by side along the first direction DR1, but the invention is not limited thereto, and the first emission window OW1 of the first path conversion unit M1 and the second emission window OW2 of the second path conversion unit M2 may be disposed to be offset from each other along the first direction DR1, by adjusting the angle between the first emission window OW1 and the second direction DR2 and the angle between the second emission window OW2 and the second direction DR2. So, the first emission beams LB11$a$, LB11$b$, LB11$c$, LB11$d$, LB11$e$, and LB11$f$ and the second emission beams LB21$a$, LB21$b$, LB21$c$, LB21$d$, LB21$e$, and LB21$f$ may be emitted to have approximately the same width along the second direction DR2.

Figure 6A:
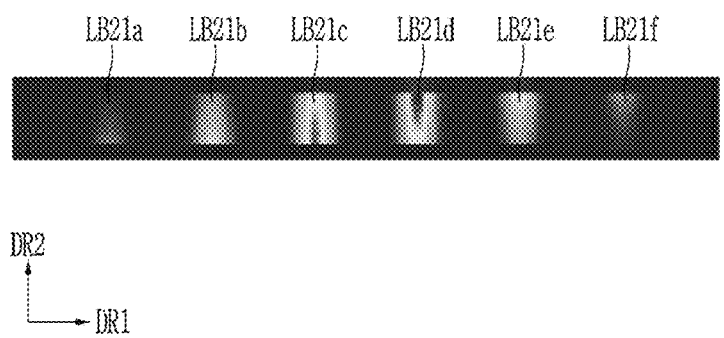
FIG. 6A and FIG. 6B are views showing a result of an experimental example.
Figure 6B:
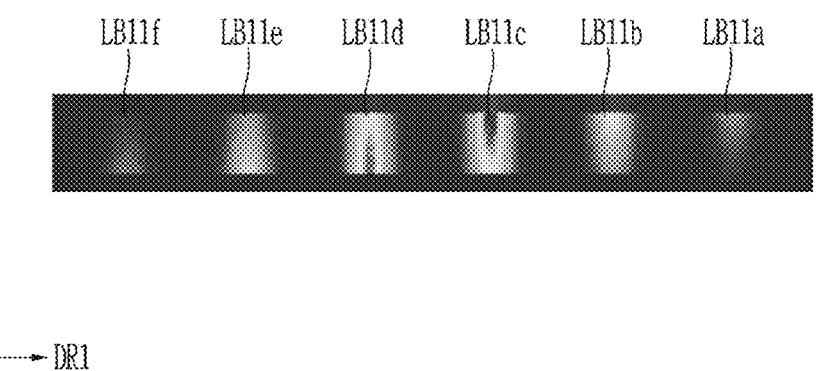
Figure 7:
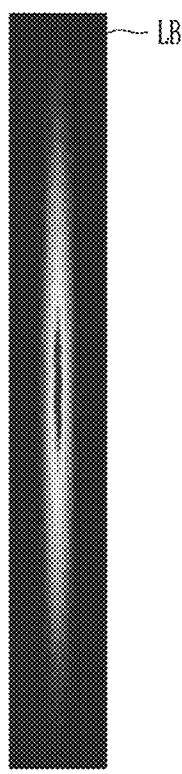
FIG. 7 is a view showing a result of another experimental example.

Next, a simulation result according to an embodiment is described with reference to FIG. 6A, FIG. 6B, and FIG. 7 along with FIG. 3 to FIG. 5. FIG. 6A and FIG. 6B are views showing a result of an experimental example, and FIG. 7 is a view showing a result of another experimental example.

FIG. 6A is an image showing the simulation result of the laser beam intensity of the first emission beams LB11$a$, LB11$b$, LB11$c$, LB11$d$, LB11$e$, and LB11$f$ emitted through the first emission window OW1 of the first path conversion unit M1, and FIG. 6B is an image showing the simulation result of the laser beam intensity of the second emission beams LB21$a$, LB21$b$, LB21$c$, LB21$d$, LB21$e$, and LB21$f$ emitted through the second emission window OW2 of the second path conversion unit M2. FIG. 7 is an image showing a simulation result of intensity of a laser beam summing a first emission beam and a second emission beam.

Referring to FIG. 6A and FIG. 6B, along with FIG. 3 to FIG. 5, the first beam LB11$a$ of the first emission beams LB11$a$, LB11$b$, LB11$c$, LB11$d$, LB11$e$, and LB11$f$ emitted through the first path conversion unit M1 and the seventh beam LB21$a$ of the second emission beams LB21$a$, LB21$b$, LB21$c$, LB21$d$, LB21$e$, and LB21$f$ emitted through the second path conversion unit M2 have the intensities that are symmetrical to each other along the first direction DR1 and the second direction DR2.

Similarly, the second beam LB11$b$ of the first emission beams LB11$a$, LB11$b$, LB11$c$, LB11$d$, LB11$e$, and LB11$f$ emitted through the first path conversion unit M1 and the eighth beam LB21$b$ of the second emission beams LB21$a$, LB21$b$, LB21$c$, LB21$d$, LB21$e$, and LB21$f$ emitted through the second path conversion unit M2 have the intensities that are symmetrical to each other with respect to the first direction DR1 and with respect to the second direction DR2.

Similarly, the third beam LB11$c$ of the first emission beams LB11$a$, LB11$b$, LB11$c$, LB11$d$, LB11$e$, and LB11$f$ emitted through the first path conversion unit M1 and the ninth beam LB21$c$ of the second emission beams LB21$a$, LB21$b$, LB21$c$, LB21$d$, LB21$e$, and LB21$f$ emitted through the second path conversion unit M2 have the intensities that are symmetrical to each other along the first direction DR1 and the second direction DR2, and the fourth beam LB11$d$ of the first emission beams LB11$a$, LB11$b$, LB11$c$, LB11$d$, LB11$e$, and LB11$f$ emitted through the first path conversion unit M1 and the tenth beam LB21$d$ of the second emission beams LB21$a$, LB21$b$, LB21$c$, LB21$d$, LB21$e$, and LB21$f$ emitted through the second path conversion unit M2 have the intensities that are symmetrical to each other with respect to the first direction DR1 and with respect to the second direction DR2.

In addition, the fifth beam LB11$e$ of the first emission beams LB11$a$, LB11$b$, LB11$c$, LB11$d$, LB11$e$, and LB11$f$ emitted through the first path conversion unit M1 and the eleventh beam LB21$e$ of the second emission beams LB21$a$, LB21$b$, LB21$c$, LB21$d$, LB21$e$, and LB21$f$ emitted through the second path conversion unit M2 have the intensities that are symmetrical to each other along the first direction DR1 and the second direction DR2, and the sixth beam LB11$f$ of the first emission beams LB11$a$, LB11$b$, LB11$c$, LB11$d$, LB11$e$, and LB11$f$ emitted through the first path conversion unit M1 and the twelfth beam LB21$f$ of the second emission beams LB21$a$, LB21$b$, LB21$c$, LB21$d$, LB21$e$, and LB21$f$ emitted through the second path conversion unit M2 have the intensities that are symmetrical to each other with respect to the first direction DR1 and with respect to the second direction DR2.

Accordingly, the laser beam LB of the sum of the first emission beams LB11$a$, LB11$b$, LB11$c$, LB11$d$, LB11$e$, and LB11$f$ emitted through the first path conversion unit M1 and the second emission beams LB21$a$, LB21$b$, LB21$c$, LB21$d$, LB21$e$, and LB21$f$ emitted through the second path conversion unit M2, as shown in FIG. 7, have the intensities that are symmetrical to each other along the first direction DR1 and the second direction DR2.

As above-described, according to the laser crystallization apparatus 100 according to the embodiment, by differentially disposing the relative positions of the first incident window IW1 and the first emission window OW1 of the first path conversion unit M1 and the second incident window IW2 and the second emission window OW2 of the second path conversion unit M2, the first emission beams LB11$a$, LB11$b$, LB11$c$, LB11$d$, LB11$e$, and LB11$f$ emitted through the first path conversion unit M1 and the second emission beams LB21$a$, LB21$b$, LB21$c$, LB21$d$, LB21$e$, and LB21$f$ emitted through the second path conversion unit M2 may be symmetrical to each other with respect to the first direction DR1 and with respect to the second direction DR2, and accordingly, the laser beam LB having the constant intensity may be emitted along the first direction DR1 and the second direction DR2.

Figure 8:
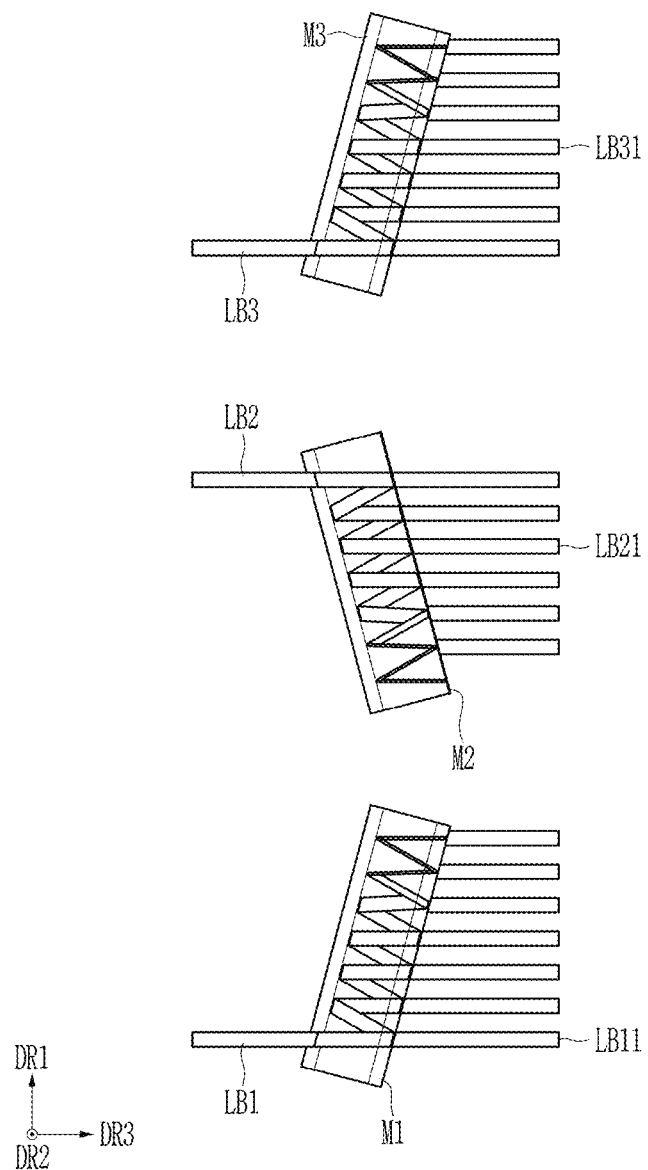
FIG. 8 is a view showing a part of a laser crystallization apparatus according to another embodiment.
Figure 9:
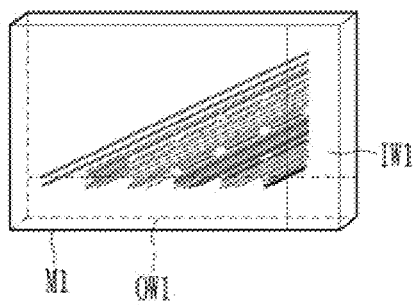
FIG. 9 is a view showing an arrangement of a part of a laser crystallization apparatus according to another embodiment.
Figure 9:
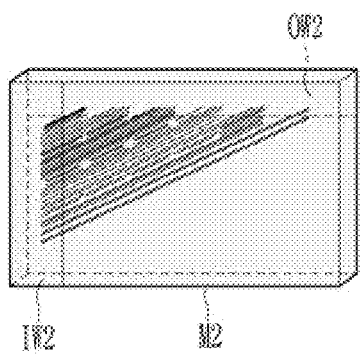
Figure 9:
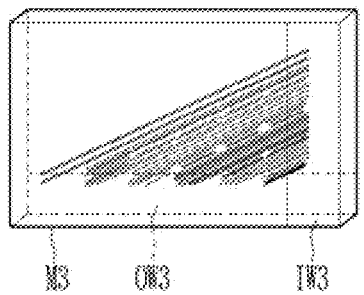
Figure 9:
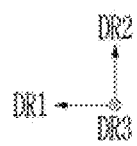

Next, a part of the laser crystallization apparatus according to another embodiment is described with reference to FIG. 8 and FIG. 9. FIG. 8 is a view showing a part of a laser crystallization apparatus according to another embodiment, and FIG. 9 is a view showing an arrangement of a part of a laser crystallization apparatus according to another embodiment.

Referring to FIG. 8, the path conversion unit of the laser crystallization apparatus according to the present embodiment includes the first path conversion unit M1, the second path conversion unit M2, and the third path conversion unit M3.

The first path conversion unit M1 and the second path conversion unit M2 of FIG. 8 may be the same as the first path conversion unit M1 and the second path conversion unit M2 of the laser crystallization apparatus according to the above-described embodiment. The detailed description of this is omitted.

The third path conversion unit M3 of the laser crystallization apparatus according to the present embodiment, as shown in FIG. 2 above, may include two reflection units Ra and Rb facing each other, the incident window IW of the shape elongated in the first length direction DLL and the emission window OW of the shape elongated in the second length direction DL2. As mentioned above, the second length direction DL2 is parallel to the first direction DR1 in a view of the third direction DR3.

Referring to FIG. 9, the third incident window IW3 and the third emission window OW3 of the third path conversion unit M3 of the laser crystallization apparatus according to the present embodiment may have the same arrangement as the first incident window IW1 and the first emission window OW1 of the first path conversion unit M1, respectively. However, differently, the third incident window IW3 and the third emission window OW3 of the third path conversion unit M3 may have the same arrangement as the second incident window IW2 and the second emission window OW2 of the second path conversion unit M2 in another embodiment. Also, differently from this, the third path conversion unit M3 may have the arrangement different from the first path conversion unit M1 and the second path conversion unit M2 in still another embodiment.

The first emission beam LB11 passing through the first path conversion unit M1, the second emission beam LB21 passing through the second path conversion unit M2, and the third emission beam LB31 passing through the third path conversion unit M3 may be diffused in the first direction DR1 and emitted to the substrate 10 with the shape of the laser beam LB having the long axis (i.e., longitudinal direction) parallel to the first direction DR1.

In the embodiment shown in FIG. 8, it is described that the third path conversion unit M3 is further included as well as the first path conversion unit M1 and the second path conversion unit M2, however it is not limited thereto, and the laser crystallization apparatus may further include an additionally path conversion unit. That is, the laser crystallization apparatus according to an embodiment may include a plurality of path conversion units, and a plurality of path conversion unit may include at least two path conversion units.

Many features of the laser crystallization apparatus according to the embodiment described above are applicable to all of the laser crystallization apparatus according to the present embodiment.

Figure 10:
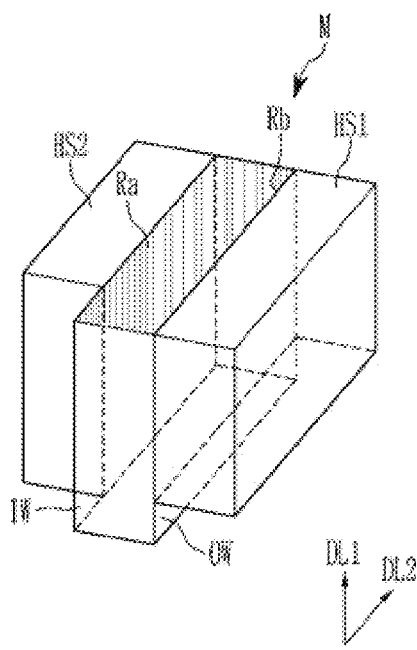
FIG. 10 is a view showing a path conversion unit of a laser crystallization apparatus according to another embodiment.

Next, the structure of the path conversion unit of the laser crystallization apparatus according to another embodiment is described with reference to FIG. 10. FIG. 10 is a view showing a path conversion unit of a laser crystallization apparatus according to another embodiment.

Referring to FIG. 10, the structure of the path conversion unit of the laser crystallization apparatus according to the present embodiment is similar to the structure of the path conversion unit of the laser crystallization apparatus according to the embodiment described with reference to FIG. 2.

The path conversion unit M of the laser crystallization apparatus according to the present embodiment includes the incident window IW to which the laser beam is incident, two reflection units Ra and Rb facing each other so as to reflect the incident laser beam, and the emission window OW to which the reflected laser beam is emitted to the outside.

The incident window IW may have a shape elongated in the direction approximately parallel to the second direction DR2 of the width direction of the laser beam LB of the line shape irradiated to the substrate 10, and the emission window OW may have a shape elongated in the direction (i.e., the second length direction DL2) approximately parallel to the first direction DR1 of the length direction of the laser beam LB of the line shape irradiated to the substrate 10. As mentioned above, the emission window OW may have a shape elongated in the direction parallel to the first direction DR1 in a view of the third direction DR3.

Two reflection units Ra and Rb face each other, the reflection unit Ra and the incident window IW form the first surface of the path conversion units M1 and M2, and the reflection unit Rb and the emission window OW form the second surface of the path conversion units M1 and M2.

Two reflection units Ra and Rb facing each other include a layer that reflects light, and for example, may include a mirror.

The path conversion unit M of the laser crystallization apparatus according to the present embodiment, differently from the path conversion units M1, M2, and M3 according to the embodiment described with reference to FIG. 2, may further include a first heat sink HS1 and a second heat sink HS2 attached to the outside of two reflection units Ra and Rb.

The first heat sink HS1 and the second heat sink HS2 prevent the heating of two reflection units Ra and Rb from which the laser beam is reflected, and thus it may be prevented that the position of the emitted laser beam is changed by the thermal lens effect due to a heating of the reflection units Ra and Rb.

Like this, according to the path conversion unit of the laser crystallization apparatus according to the present embodiment, by attaching two heat sinks on the outside of two reflection units facing each other, the heating of the reflection unit may be prevented without affecting the reflection of the laser beam, thereby the laser beam may be uniformly emitted.

The features of the path conversion unit according to the embodiment described with reference to FIG. 10 are all applicable to the laser crystallization apparatus according to the embodiment described above.

Figure 11:
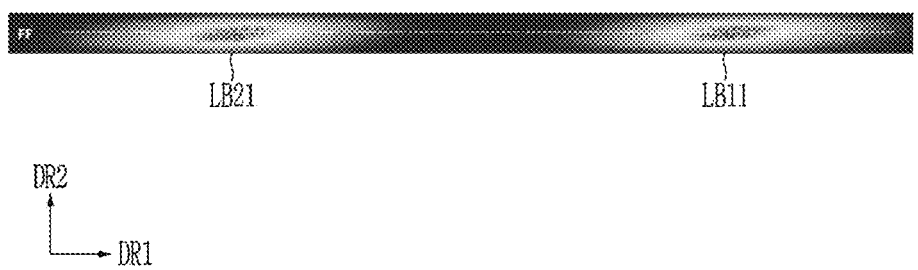
FIG. 11 is a view showing a result of an experimental example.

Next, an experimental example is described with reference to FIG. 11 and FIG. 12. FIG. 11 is a view showing a result of an experimental example, and FIG. 12 is a graph showing a result of an experimental example.

Figure 12:
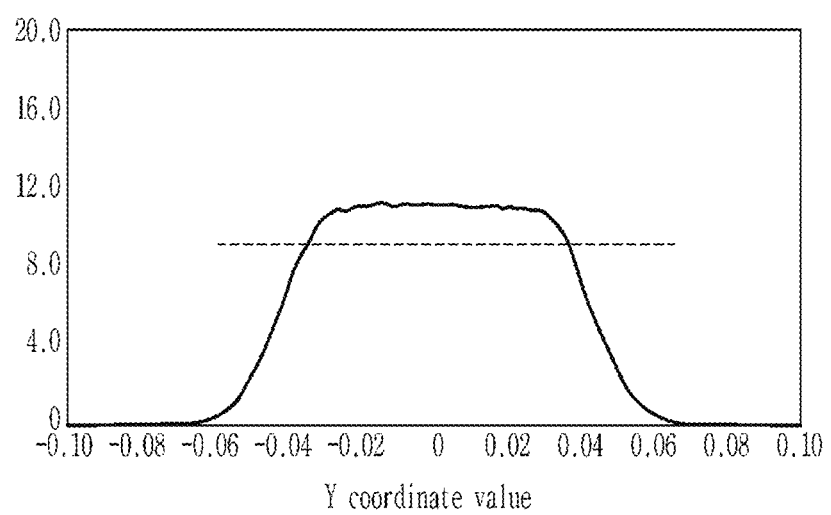
FIG. 12 is a graph showing a result of an experimental example.

In the present experimental example, like the laser crystallization apparatus according to an embodiment, a plurality of path conversion units M1 and M2 are formed, the intensity according to the positions of the emission beams LB11 and LB21 passing through a plurality of path conversion units M1 and M2 is measured, the simulation result according to the long axis and the short axis of the linear laser beam LB is shown in FIG. 11, and the graph of the intensity for the short axis of the linear laser beam LB is shown in FIG. 12.

Referring to FIG. 11, as above-described, it may be confirmed that the first emission beam LB11 emitted through the first path conversion unit M1 and the second emission beam LB21 emitted through the second path conversion unit M2 are symmetrical to each other with respect to the first direction DR1 parallel to the long-axis direction of the linear laser beam LB and with respect to the second direction DR2 parallel to the short-axis direction of the linear laser beam LB.

Therefore, even if the first path conversion unit M1 and the second path conversion unit M2 are heated by the laser beam so that the thermal lens effect occurs, the linear laser beam LB of which the first emission beam LB11 emitted through the first path conversion unit M1 and the second emission beam LB21 emitted through the second path conversion unit M2 are summed and may have the uniform symmetrical intensity along the first direction DR1 and the second direction DR2.

Referring to FIG. 12, it may be confirmed that the linear laser beam LB has the uniform intensity along the short-axis direction (a Y-coordinate).

Figure 13:
FIG. 13 is a view showing a result of an experimental example.

Next, another experimental example is described with reference to FIG. 13 and FIG. 14. FIG. 13 is a view showing a result of an experimental example, and FIG. 14 is a graph showing a result of an experimental example.

Figure 14:
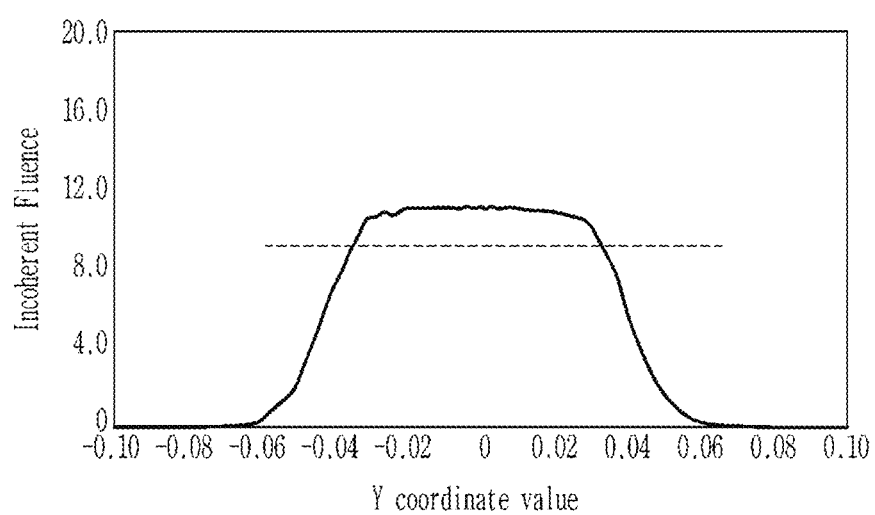
FIG. 14 is a graph showing a result of an experimental example.

In the present experimental example, for a case that a plurality of path conversion units M1 and M2 are formed like the laser crystallization apparatus according to an embodiment and the heat sinks HS1 and HS2 are installed outside two reflection units Ra and Rb facing each other of a plurality of path conversion units M1 and M2, like the embodiment shown in FIG. 10, the intensity depending on the position of the emission beams LB11 and LB21 passing through a plurality of path conversion units M1 and M2, the simulation result according to the long axis and the short axis of the linear laser beam LB is shown in FIG. 13, and the graph of the intensity for the short axis of the linear laser beam LB is shown in FIG. 14.

Referring to FIG. 13, as above-described, it may be confirmed that the first emission beam LB11 emitting through the first path conversion unit M1 and the second emission beam LB21 emitted through the second path conversion unit M2 have the intensities that are symmetrical to each other with respect to the first direction DR1 parallel to the long-axis direction of the linear laser beam LB and with respect to the second direction DR2 parallel to the short-axis direction of the linear laser beam LB. Like this, by installing the heat sinks HS1 and HS2 outside of two reflection units Ra and Rb facing each other of a plurality of path conversion units M1 and M2, the first emission beam LB11 emitted through the first path conversion unit M1 and the second emission beam LB21 emitted through the second path conversion unit M2 have the intensities that are symmetrical to each other with respect to the first direction DR1 and with respect to the second direction DR2.

In this way, even when the laser beam of strong energy is irradiated to the first path conversion unit M1 and the second path conversion unit M2, it may be confirmed that the thermal lens effect is not generated by the heat sink, so that the linear beam of uniform intensity may be irradiated over the wide area.

Referring to FIG. 14, it may be confirmed that the linear laser beam LB has uniform intensity along the short-axis direction (the Y-coordinate).

Figure 15:
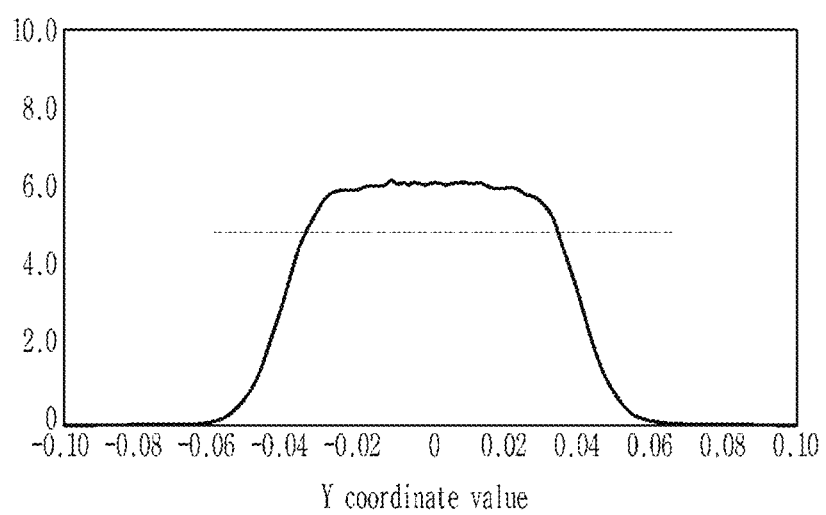
FIG. 15 and FIG. 16 are graphs showing a result of an experimental example.
Figure 16:
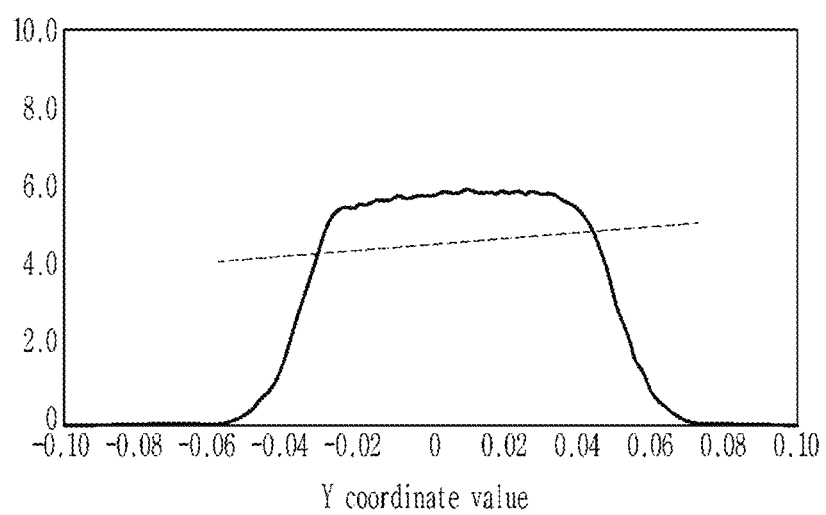

Next, another experimental example is described with reference to FIG. 15 and FIG. 16. FIG. 15 and FIG. 16 are graphs showing a result of an experimental example.

In the present experimental example, like the laser crystallization apparatus according to the embodiment, a first case of forming a plurality of path conversion units M1 and M2 and a second case of using a plurality of mirrors like a conventional art, the intensity for the short axis of the emission beam passing through a plurality of path conversion units M1 and M2 and the emission beam reflected by a plurality of mirrors, and a result thereof is shown in FIG. 15 and FIG. 16. FIG. 15 shows the result of the first case, and FIG. 16 shows the result of the second case.

Referring to FIG. 15, it may be confirmed that the first case like the laser crystallization apparatus accord to the embodiment has the constant intensity according to the short-axis direction (the Y-coordinate), however referring to FIG. 16, it may be confirmed that the intensity of the emission beam is not constant according to the short-axis direction in the second case like the conventional art.

As such, according to the laser crystallization apparatus according to the embodiment, it may be confirmed that the incident beam may be converted into the linear emission beam through the simple structure by including the integrated path conversion unit including two reflection units facing each other, the incident window, and the emission window, and the linear laser beam having the uniform intensity may be provided along the long-axis direction and the short-axis direction of the linear laser beam by including a plurality of path conversion units of which the relative positions of the incident window, the emission window, and two reflection units are different from each other.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: substrate
100: laser crystallization apparatus
HS1, HS2: heat sink
IW, IW1, IW2, IW3: incident window
LB, LB1, LB2: laser beam
LB11, LB21, LB31: emission beam
LS1, LS2: light source unit
M, M1, M2, M3: path conversion unit
OP: optical unit
OW, OW1, OW2, OW3: emission window
R1, R2, R3, R3, Ra, Rb: reflection unit

What is claimed is:

1. A laser crystallization apparatus comprising:
   a plurality of light source units which irradiates a laser beam; and
   a first path conversion unit and a second path conversion unit which convert the laser beam incident from the light source units into a linear beam having a long axis parallel to a first direction and a short axis parallel to a second direction,
   wherein the first path conversion unit includes a first incident window, a first emission window, a first reflection unit, and a second reflection unit,
   the second path conversion unit includes a second incident window, a second emission window, a third reflection unit, and a fourth reflection unit, the first incident window of the first path conversion unit, the first reflection unit of the first path conversion unit, the third reflection unit of the second path conversion unit, and the second incident window of the second path conversion unit are sequentially positioned along the first direction, the first emission window of the first path conversion unit and the second reflection unit of the first path conversion unit are sequentially positioned along the second direction, and the fourth reflection unit of the second path conversion unit and the second emission window of the second path conversion unit are sequentially positioned along the second direction.

2. The laser crystallization apparatus of claim 1, wherein the first incident window and the second incident window extend parallel to a first length direction, the first emission window and the second emission window extend parallel to a second length direction crossing the first length direction, the linear beam propagates in a third direction perpendicular to the first direction and the second direction, and the second length direction extends parallel to the first direction in a view of the third direction.

3. The laser crystallization apparatus of claim 2, wherein the first reflection unit and the second reflection unit face each other along a direction perpendicular to the first length direction and the second length direction, and the second reflection unit and the fourth reflection unit face each other along the direction perpendicular to the first length direction and the second length direction.

4. The laser crystallization apparatus of claim 3, wherein the first incident window, the first emission window, the first reflection unit, and the second reflection unit are monolithic, and the second incident window, the second emission window, the third reflection unit, and the fourth reflection unit are monolithic.

5. The laser crystallization apparatus of claim 4, wherein the first path conversion unit and the second path conversion unit are separated from each other along the first direction.

6. The laser crystallization apparatus of claim 4, further comprising:
a first heat sink disposed outside the first reflection unit; and
a second heat sink positioned outside the second reflection unit.

7. The laser crystallization apparatus of claim 1, further comprising:
a first heat sink positioned outside the first reflection unit; and
a second heat sink positioned outside the second reflection unit.

8. A laser crystallization apparatus comprising:
a plurality of light source units which irradiates a laser beam; and
a first path conversion unit and a second path conversion unit which convert the laser beam incident from the light source units into a linear beam having a long axis parallel to a first direction and a short axis parallel to a second direction,
wherein the first path conversion unit includes a first incident window, a first emission window, a first reflection unit, and a second reflection unit,
the second path conversion unit includes a second incident window, a second emission window, a third reflection unit, and a fourth reflection unit,
the first incident window and the second incident window extend parallel to a first length direction,
the first emission window and the second emission window extend parallel to a second length direction crossing the first length direction,
the linear beam propagates in a third direction perpendicular to the first direction and the second direction, and
the second length direction extends parallel to the first direction in a view of the third direction.

9. The laser crystallization apparatus of claim 8, wherein the first reflection unit and the second reflection unit face each other along a direction perpendicular to the first length direction and the second length direction, and
the second reflection unit and the fourth reflection unit face each other along the direction perpendicular to the first length direction and the second length direction.

10. The laser crystallization apparatus of claim 9, wherein the first incident window, the first emission window, the first reflection unit, and the second reflection unit are monolithic, and
the second incident window, the second emission window, the third reflection unit, and the fourth reflection unit are monolithic.

11. The laser crystallization apparatus of claim 10, wherein
the first path conversion unit and the second path conversion unit are separated from each other along the first direction.

12. The laser crystallization apparatus of claim 10, further comprising:
a first heat sink disposed outside the first reflection unit; and
a second heat sink positioned outside the second reflection unit.

13. The laser crystallization apparatus of claim 8, further comprising:
a first heat sink disposed outside the first reflection unit; and
a second heat sink positioned outside the second reflection unit.

* * * * *